(12) United States Patent
Ritter

(10) Patent No.: US 7,589,728 B2
(45) Date of Patent: Sep. 15, 2009

(54) DIGITAL OSCILLOSCOPE DISPLAY AND METHOD FOR IMAGE QUALITY IMPROVEMENT

(75) Inventor: Gilles Ritter, Ollon (CH)

(73) Assignee: Lecroy Corporation, Chestnut Ridge, NY (US)

( * ) Notice: Subject to any disclaimer, the term of this patent is extended or adjusted under 35 U.S.C. 154(b) by 870 days.

(21) Appl. No.: 10/941,319

(22) Filed: Sep. 15, 2004

(65) Prior Publication Data

US 2006/0055698 A1    Mar. 16, 2006

(51) Int. Cl.
  G09G 5/22   (2006.01)
  G06K 9/00   (2006.01)
(52) U.S. Cl. .............. 345/440.1; 382/168; 382/169; 382/170; 382/171; 382/172
(58) Field of Classification Search .......... 345/440.1; 382/168–172
See application file for complete search history.

(56) References Cited

U.S. PATENT DOCUMENTS

| | | | |
|---|---|---|---|
| 4,890,237 A | 12/1989 | Bales et al. | |
| 5,255,365 A | 10/1993 | Hungerbuhler | |
| 5,550,963 A * | 8/1996 | Siegel et al. | 345/440 |
| 6,151,010 A | 11/2000 | Miller et al. | |
| 6,614,432 B1 * | 9/2003 | Merrill | 345/428 |
| 6,792,141 B2 * | 9/2004 | Huniu | 382/169 |
| 7,020,329 B2 * | 3/2006 | Prempraneerach et al. | 382/164 |
| 7,035,461 B2 * | 4/2006 | Luo et al. | 382/167 |
| 7,139,426 B2 * | 11/2006 | Ivers et al. | 382/169 |
| 7,216,046 B2 * | 5/2007 | Agoston et al. | 702/70 |
| 2003/0107574 A1 | 6/2003 | Ritter | |

* cited by examiner

Primary Examiner—M Good Johnson
(74) Attorney, Agent, or Firm—Frommer Lawrence & Haug LLP; William S. Frommer

(57) ABSTRACT

A method and apparatus for displaying an acquired signal on an oscilloscope. The method comprises the steps of acquiring an analog signal, digitizing the analog signal and determining a plurality of samples generated by the digitizing that are to be represented by a same vertical pixel column on a display. Thereafter, a histogram of the values of the determined plurality of samples is generated, and a display characteristic of information displayed in the vertical pixel column is modified based upon the generated values of the histogram.

17 Claims, 6 Drawing Sheets

DIGITAL OSCILLOSCOPE DISPLAY AND METHOD FOR IMAGE QUALITY IMPROVEMENT

BACKGROUND OF THE INVENTION

Test instruments, such as oscilloscopes, have evolved to include substantially more memory than in the past. This increased memory has allowed such instruments to sample and store more data points of an acquired waveform. This large amount of data must be somehow displayed to allow a user analyze the acquired signal. A standard method of drawing a signal on screen is to draw a line joining each pair of adjacent points representing the captured signal. This method works fine with a small amount of data, but as soon as the number of data points increases, this method becomes very slow. This is due to the fact that drawing each line on the display device requires the main processor to access the hardware of the display device, a very slow operation as compared to the processor capability. The latest test instruments can record up to multiple millions of data values. Drawing multiple millions of lines on the display device can therefore become a very slow process and may take up to several seconds (an extremely long period of time). This procedure becomes particularly burdensome when the number of adjacent pixel pairs is substantially greater than the number of pixels that can be displayed on the screen. Not only does the display device need to be accessed for each line to be drawn, because of the lower display resolution, many of these lines will be drawn overlapping other previously or subsequently drawn lines in the same vertical pixel columns. Thus, the multiple, slow display access does not even result in the display of additional useful information to a user.

Traditionally, whether lines are drawn on the display between every adjacent pair of acquired data points or the lines are drawn after application of a compaction procedure, the rendering has been performed by drawing all lines on the display with same color and same intensity. This drawing procedure has two major negative side effects as compared to traditional rendering of data on an old analog display. It increases the import of visible noise on the rendered waveform, and also hides the internal structure of the rendered waveform, two things that are not issues with the analog display.

One such traditional method is shown in, for example, U.S. Pat. No. 5,255,365 and US Published Patent Application Number 20030107574, in which the data are compacted using a min/max method in order to draw vertical lines representative of the data on the display device. This method consists of examining every data sample that is to be drawn at the same vertical pixel column to find the minimum and maximum value of the data samples. After determining those min/max values, a single vertical line can be drawn in the pixel column instead of a multitude of overlapped lines. This technique is then applied to every pixel column in the display. The resulting display appears exactly the same as a display made by drawing a single line between every data sample (see FIGS. 2c, 3c, 4d). Because only a single line is drawn, there is no indication of the distribution of data values along that single line. Thus both methods (drawing each line and drawing a single line) have the disadvantage of hiding the internal statistical structure of the source signal. Also, because all data is drawn with the same intensity, each of the processes increases the visible noise of the measured signal.

Another traditional method that attempts to give a user additional information regarding the displayed information is show in U.S. Pat. No. 4,890,237. In this prior art method, the display of values in a spectrum analyzer is modified so that the intensity of each pixel element is a function of the number of samples at a particular power level within a predetermined frequency interval. While this shows the use of color to represent a third dimension, that of histogram values, in the prior art method, each of the histogram bins displayed on the display corresponds to a single frequency band. Thus, there is no consideration for compressing a number of y-axis values into a displayable number of values. Additionally, the spectrum analyzer inherently accumulates histogram values for its display. However, this prior art method gives no teaching how to display information that is acquired over time, and not previously accumulated into a histogram. Thus, while this prior art method is used to display histogrammed information, as will be discussed below, the present invention is concerned with using a histogram technique to display information that is not typically maintained or accumulated in a histogram.

SUMMARY OF THE INVENTION

In accordance with the invention, a new method has been developed by the inventors in order to reduce extra visible noise and loss of internal structure in a displayed data, such as waveform data, as noted above.

To avoid the problem of a large required drawing time, in accordance with the invention, the number of times a display device is accessed is reduced. A compaction procedure is performed on the data values before being forwarded to the display. The compaction process is applicable only when the number of data values is greater than the horizontal number of pixels that are able to be displayed on the display, which as noted above, is common in the present long-memory environment. Because the number of data values is greater than the number of pixels on the display, multiple data values are represented in the same vertical pixel column, as noted above. In terms of drawing lines on the display, without the use of some sort of compaction processing, multiple lines would have to be drawn overlapping each other. The compaction procedure in accordance with the invention therefore consists of examining all of the data values that will be represented by the same vertical pixel column in the display, determining the information that will be written to the vertical pixel column representing all of the corresponding data values, and repeating the procedure for every vertical pixel column. Once the compaction procedure has been applied, this compacted data is then used to render the acquired signal on the display device.

In accordance with the invention, vertical histograms are used instead of min/max pair data (or other techniques) to render the signal on the display. As noted above, the min/max pair prior art procedure allows only a single line of a single color and intensity to be drawn between two data points in a vertical pixel location. In contrast, in accordance with the present invention, a histogram keeps track of a statistic based upon the number of times each of the pixels in the same vertical pixel column have been hit by the various signals. After this histogram data has been stored, the rendering process employs use different color and/or intensity to show the internal structure of the source signal based upon the accumulated histogram data. Additionally, any noise which tends to extend the min/max value will have less representation in the histogram values than the signal information, and therefore this noise will be rendered with low intensity and be less visible in the display (see FIGS. 2b, 3b, 4c).

The intensity used to display the internal structure of the source signal can then be controlled using a desired saturation definition. The user can select a saturation level in order to reveal more or less of the internal structure of the signal. While saturation techniques for displaying waveform data have been used in the past (see, for example, U.S. Pat. No. 6,151,010), the application of such a saturation technique for each single acquisition is new in this invention. In the prior art, the technique is applied only to multiple acquisitions, and therefore accumulating data for more than one waveform. Therefore, an object of this invention is to provide an improved method and apparatus for displaying an acquired signal using digital oscilloscope.

A further object of the invention is to enhance the display quality of a digitally acquired signal in order to reflect the most precisely the source signal.

Still another object of the invention is to allow the user to have, at first look, a better understanding of the nature of the acquired signal.

Yet another object of the invention is to provide a display technique on a digital oscilloscope having a quality more similar to an analog scope than has traditionally been possible.

The technique of the invention is applicable to digitally acquired signals with a large number of data samples, specifically when there are more samples than the number of horizontal pixels in the display.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combinations of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The invention is applicable to oscilloscopes specifically, and to test and measurement apparatuses more generally. Such oscilloscopes and test and measurement equipment typically include some type of acquisition module, board, or other data input for receiving an analog or digital signal. In a digital oscilloscope or test and measurement equipment, the analog signal is then converted into a digital in accordance with various analog to digital processors or converters and processing steps. Once the digital signal is generated, the data may be stored, manipulated, tested, etc. by one or more processors that are programmed to provide the desired functionality. Typically a display of one or more of the received and manipulated data information is displayed on a display. The oscilloscope or test equipment may be contained in a single unit, or may be spread out, for example, including an acquisition system, a computer for storing, manipulating, testing, etc. the data, and a display device for displaying desired information.

As noted above, there are two main disadvantages of the prior art rendering display techniques on oscilloscopes and other test measurement equipment. The first is that with noisy signals, noise is rendered on the display at the same intensity as the acquired signal data itself. This gives the appearance of equal importance of the noise and the signal data, thus increasing the effect of noise on the rendering of the signal. The second disadvantage is that because the rendering of the data is performed using the same intensity or color for all data on the display, the internal structure of the signal may be lost. As will be described below, the present invention addresses each of these issues.

Figure 1:
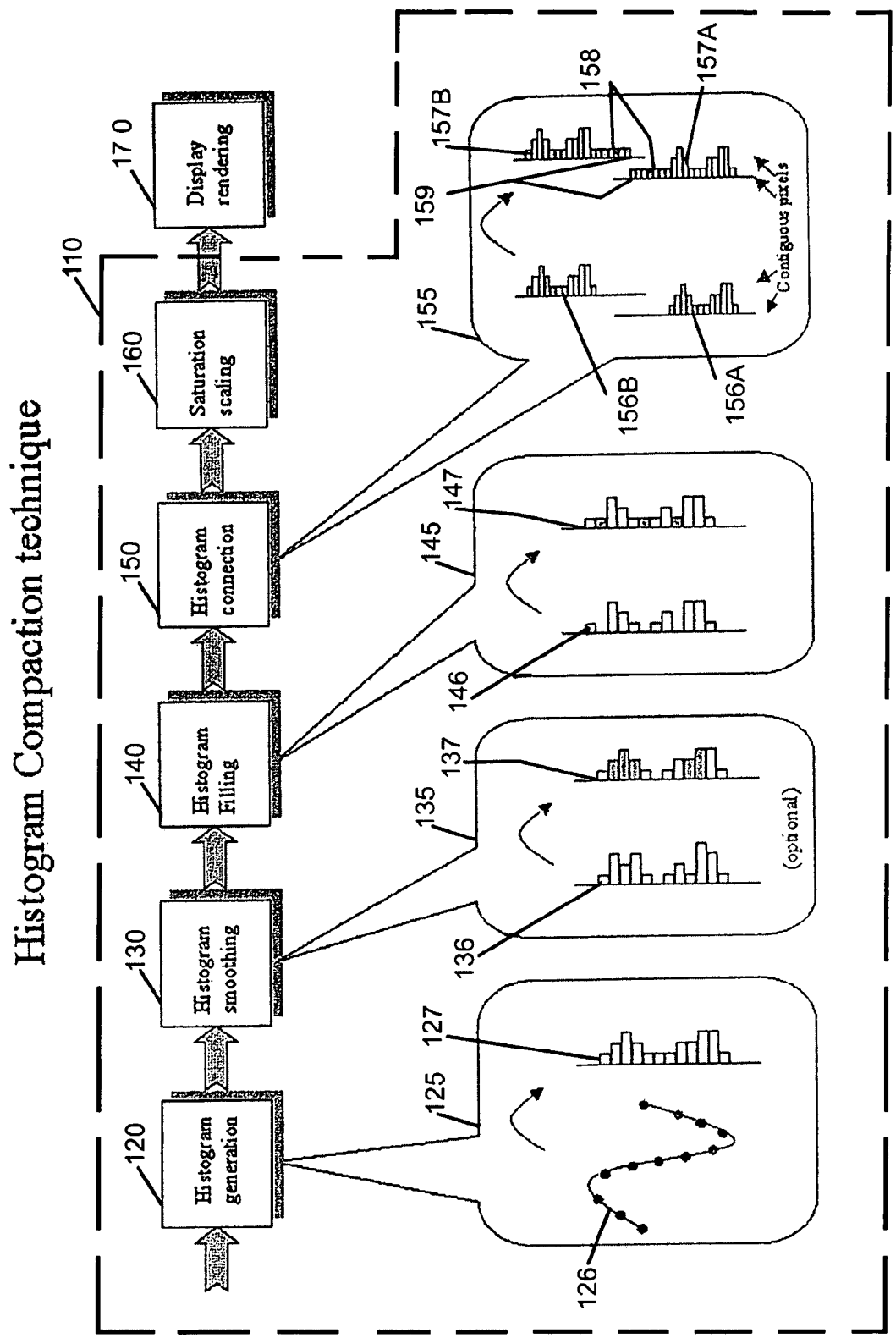
FIG. 1 is flow chart diagram depicting the method of the histogram compaction technique in accordance with the invention.

Referring first to FIG. 1, a histogram compaction technique in accordance with the invention is shown. FIG. 1 is divided in two major segments: the first portion comprises the steps for performing a compaction process and the second portion comprises the steps for performing a rendering process.

The compaction process (shown at 110 of FIG. 1) consists of first analyzing information for all of the data samples that are to be represented in a same single vertical pixel column. The analysis further comprises the computing of a histogram of the analyzed information to be represented in the same vertical pixel column. This procedure is then repeated for each vertical pixel column. This histogram generation process is represented at block 120, breakout 125 depicting the processing results. Thus, a set of pixel values 126 to be represented in a single vertical pixel column are accumulated into a vertical histogram 127. As noted above, this process is performed for each vertical pixel column. Thus, after processing all of the samples of an acquired data signal, a list of vertical histograms is generated, one for each vertical pixel column. The resolution of the histograms can be controlled by selection of the number and size of the histogram bins to allow for more or less resolution to be displayed by the rendered display.

After all of the vertical histograms have been generated, control passes to the next step 130. Depending on the resolution used for the vertical histogram, a striping effect may be generated where certain histogram bins are more populated than others in an order that does not provide a smooth curve. This situation is typically caused by not enough data samples being collected relative to the number of histogram bins, thus resulting in other than a smooth curve being generated. If desired, this side effect may be smoothed out using different standard histogram interpolation techniques. Thus, as is shown in breakout 135, each generated vertical histogram 136 may be smoothed out to generate a smoothed histogram 137 by changing some of the histogram values. This step is optional depending on the nature of the source signal and the histogram resolution (i.e. if a smooth histogram has already been generated). This step can be skipped if desired. It can also be performed after the histogram filling step (to be described below) instead of before the smoothing step.

After completion of histogram smoothing (or, alternatively, before or in lieu of histogram smoothing), the processing passes to a histogram filling step 140. Based on the number of bins chosen and data samples acquired, some of the histogram bins may have zero entries, thus generating a hole (discontinuity) in the curve between two populated bins. Such a hole does not reflect reality, because the acquired data signal is an analog signal, and therefore continuous. To compensate for this sampling effect, the holes are filled with a one-populated bin (or other small value relative to the total number of counted data samples) to simulate that the signal has hit the histogram bin at least one or more times, but not often. Thus, as shown in breakout 145, a generated histogram 146 is converted to a histogram 147 so that there are no empty spaces in the histogram. This process is repeated for each of the generated vertical histograms, as necessary.

After filling in the blanks, processing passes to step 150 in which any discontinuity between two adjacent histograms is removed, if necessary, so that the adjacent histograms can be connected. As is shown in breakout 155, this step is necessary when a maximum signal value represented by a histogram 156 A is smaller than a minimum signal value represented by an adjacent histogram 156 B or vice-versa. When placed in adjacent vertical pixel columns, if a discontinuity is present, a space will appear between the columns, once again a result that is undesirable when presenting a digital representation of an acquired analog signal. This discontinuity is removed by filling portions of both histograms with several one-populated bins 158 to fill in the empty bins. A connection point 159 between the histograms is defined at the middle of the value of the last data sample of histogram 156 A and the first data sample of histogram 156 B. This data is filled in from each of the histograms up to the connection point. The data is filled in and therefore removes the discontinuity in the histograms that is generated by sampling effect. The resulting histograms 157 A and 157 B may be placed adjacent each other, depicting a continuous signal.

The last step 160 of the compaction process consists of applying a saturation control to all of the resulting vertical histograms for the single acquisition. This saturation control allows a user to define how a range of colors or grey scale will represent values in the various histograms. A plurality of colors, or grey scale values, are assigned to one or more of a plurality of corresponding histogram values. Thus, for example, if histogram bins include between one and 100 values, and ten colors or grey scale values are available, a user may select saturation control so that values of 1-10 are shown in a first color or grey scale value, values of 11-20 are shown in a second color or grey scale, etc. Thus, while covering all possible values, detail is not preserved. Alternatively, a user can select that the various colors or grey scale represent histogram values between 51-60 only. Thus, in this example each value between 51-60 would be represented by a different color or grey scale value. While precise detail is provided between 51 and 60, all values below 51 and greater than 60 would not be included in this variation. Of course, any intermediate values may be selected, based upon the desired range and detail of values to be represented.

In accordance with this process, the population of all of the vertical histograms are scaled and saturated according to saturation control requirements as defined by the user, or as automatically defined. Control of this saturation allows a user to define the internal structure that is to be visible to a user, and therefore allows the user to define portions of the signal structure that are to be looked at inside the signal for low or high populated regions. The effect is similar to a trace intensity control function provided on an analog scope.

After completion of the histogram building process, a display rendering process 170 is performed, and consists of translating each histogram value into a color or grey scale value where the color or grey scale intensity corresponds to the histogram value. Then the resulting data is drawn to the display device with those colors or grey scale values.

In case the vertical histogram resolution doesn't correspond to the height in pixels of the display device, the vertical histograms must be rescaled vertically in order to fit the display device height. A simple technique consists of duplicating several histogram lines when the histogram resolution is smaller than the display height. One could also interpolate various histogram values between the generated histograms. When the histogram resolution is greater than the display height, two or more histogram lines must be combined into one single vertical pixel line. In a simple method, this combination is performed by using the maximum value of every histogram line in the same vertical pixel column. Other standard interpolation techniques such as linear, cubic interpretations can also be used instead of the simple method.

The technique of the invention extends beyond the technique described in patent U.S. Pat. No. 5,255,365 and published US patent application US 20030107574 (both noted above). In accordance with the invention, the compaction process uses vertical histograms instead of the min/max pairs of the prior art. Then several additional process steps are added (FIG. 1): histogram smoothing, histogram filling, histogram connection, and saturation scaling. The histogram connection procedure, while appearing similar to the min/max connection process of the prior art is different in that when using the histogram process, several one-populated bins are added to the histogram while for the min/max technique, the min/max values are simply extended. Finally the rendering process of the invention uses a color or grey scale value table to map the histogram value into color or grey scale intensity, while the prior art technique simply uses a single color for rendering.

The technique of the invention applies to a single sweep acquisition, while procedures applied in the prior art have applied a histogramming technique only to a multiple sweep acquisition in order to generate a statistic over time. The goal of the prior art is very different in the sense that it provides statistical data over time for multiple acquisitions from which measurements can be performed while the present invention generates histograms for defined portions of a single acquisition. Another difference is that the prior art does not provide a histogram smoothing, a histogram filling or a histogram connection step.

Figure 2A:
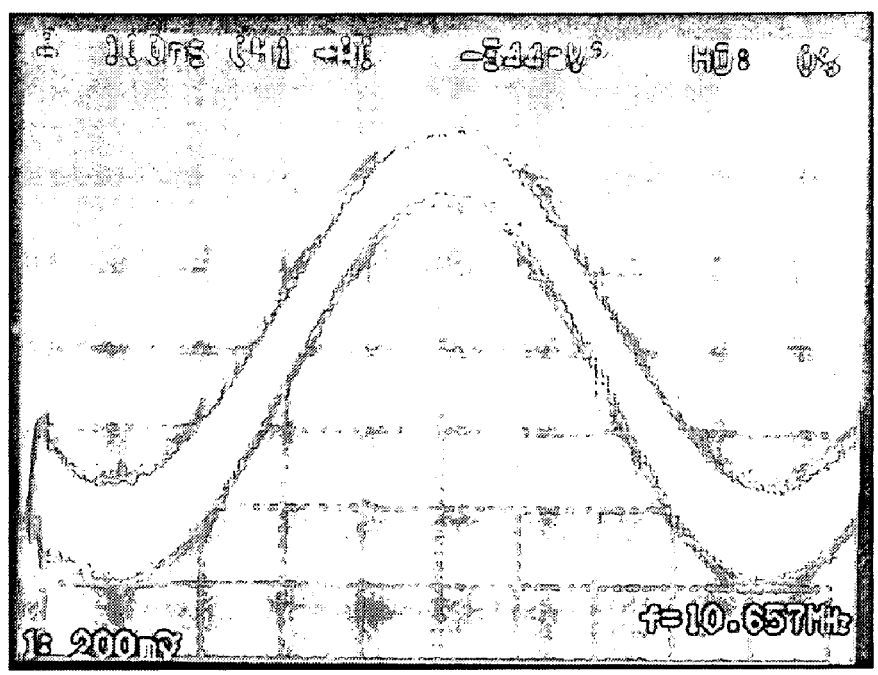
FIG. 2a is a screen shot of a noisy data signal acquired with an analog oscilloscope.

Referring next to FIGS. 2a-4d, the effects generated in accordance with the invention will be described. FIG. 2a is a screen shot depicting a noisy signal acquired by an analog oscilloscope. As can be seen, the portions at the center of the signal are of a more intense color (grey scale), while the edges, that would be less by the signal, are of a less intense color (grey scale). FIG. 2b is a screen shot of the same noisy signal acquired by a digital oscilloscope, and rendered on the display in accordance with the histogram compaction technique in accordance with the invention. As can be seen, this display shows a similar gradient between the center and outer portions of the signal as the analog oscilloscope. Thus, the center portions have histograms with higher counts in the bins, while the edges have histogram bins with lower counts. Looking at the edge of the displayed signal; one can see the vertical line used to render the signal. In contrast, FIG. 2c depicts the same noisy signal acquired with a digital oscilloscope, and rendered in accordance with a min/max technique. While the outer boundaries of the signal in FIGS. 2b and 2c are similar, it can be easily seen that the rendering technique of the invention allows for the internal structure of the displayed signal while the prior art does not. The levels of distinction in the display in FIG. 2b may be controlled in accordance with the selection of saturation parameters, as noted above with respect to FIG. 1. while the figure show the display rendered in grey scale, it is contemplated that in a preferred embodiment, the display be rendered in color to give a display in which the internal structure of the signal can be even more easily ascertained. Furthermore, other display characteristics may be modified along with, or in lieu of the color changes, in accordance with the histogram values in order to further define the value on the display.

Figure 2B:
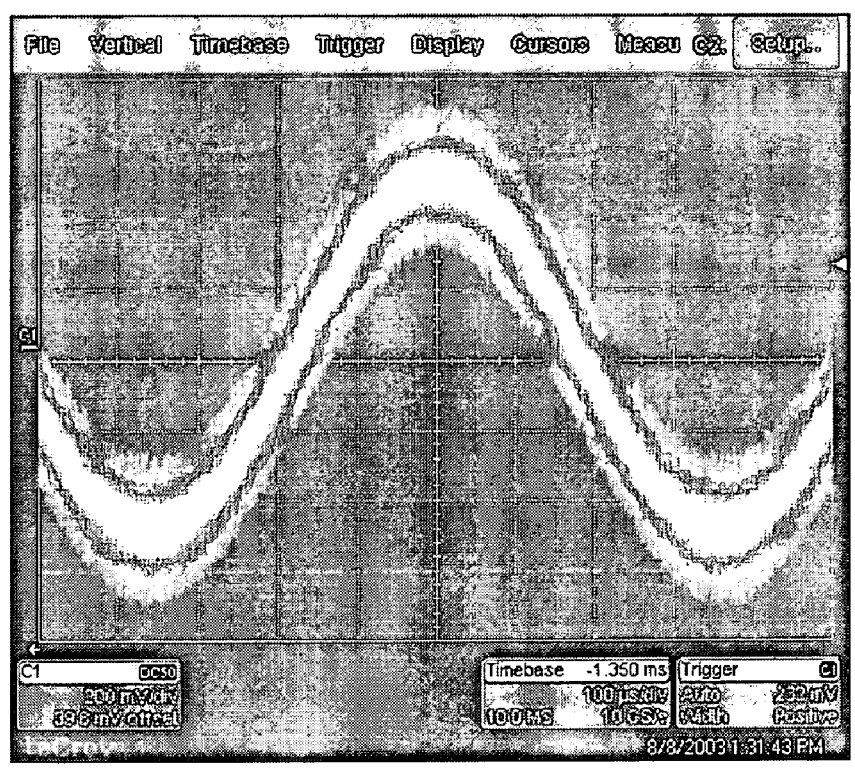
FIG. 2b is a screen shot of noisy data signal acquired with a digital oscilloscope, and rendered in accordance with the histogram compaction technique of the invention.
Figure 2C:
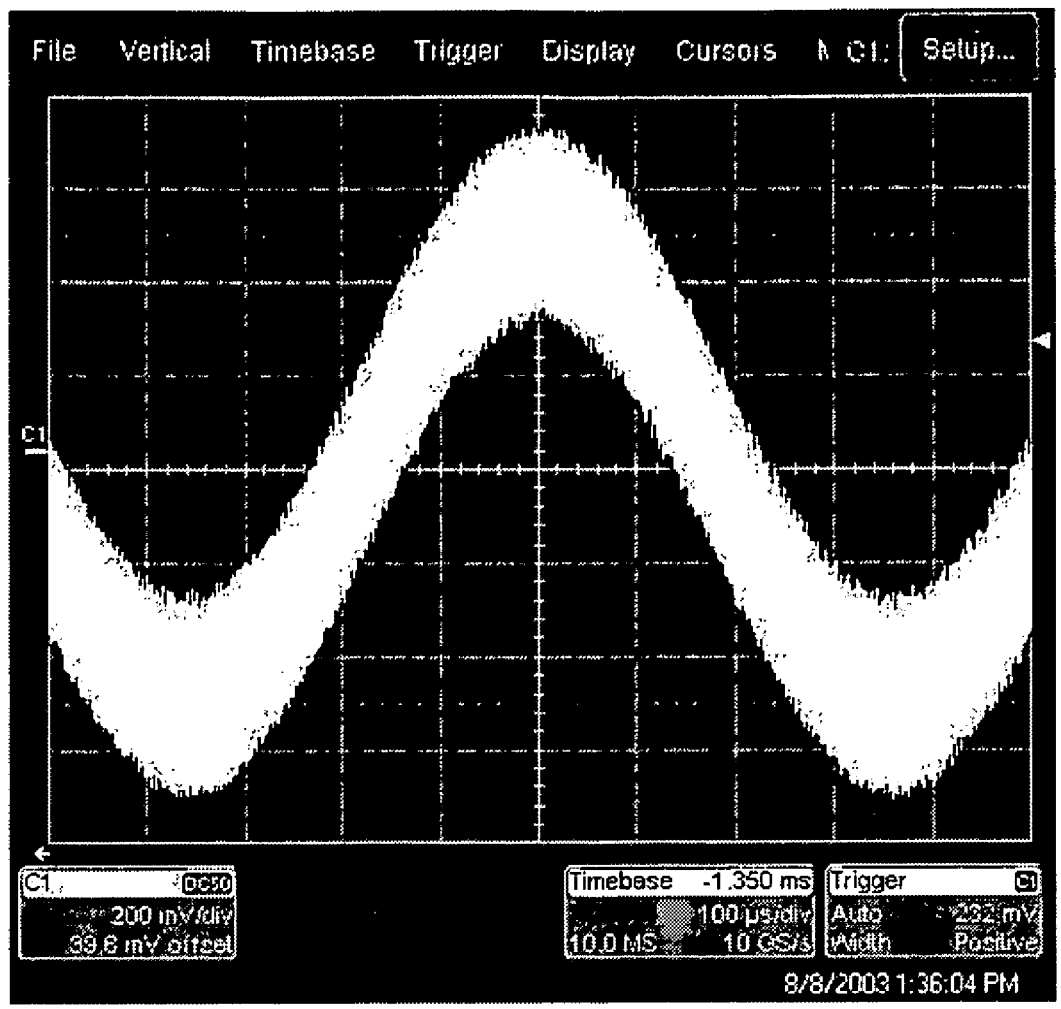
FIG. 2c is a screen shot of a noisy data signal acquired with a digital oscilloscope, and rendered in accordance with a min/max technique.
Figure 3A:
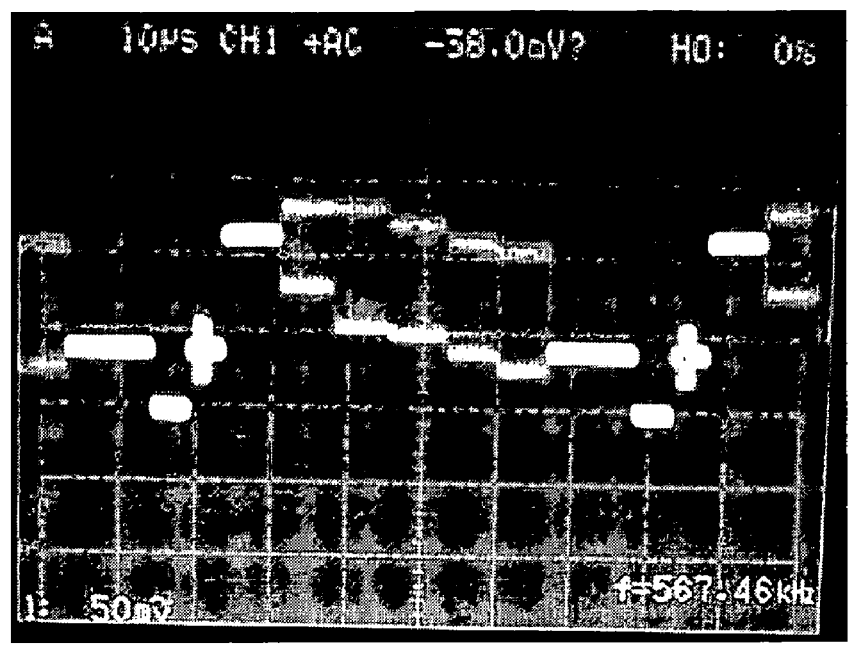
FIG. 3a is a screen shot of a noisy television signal acquired with an analog oscilloscope.
Figure 3B:
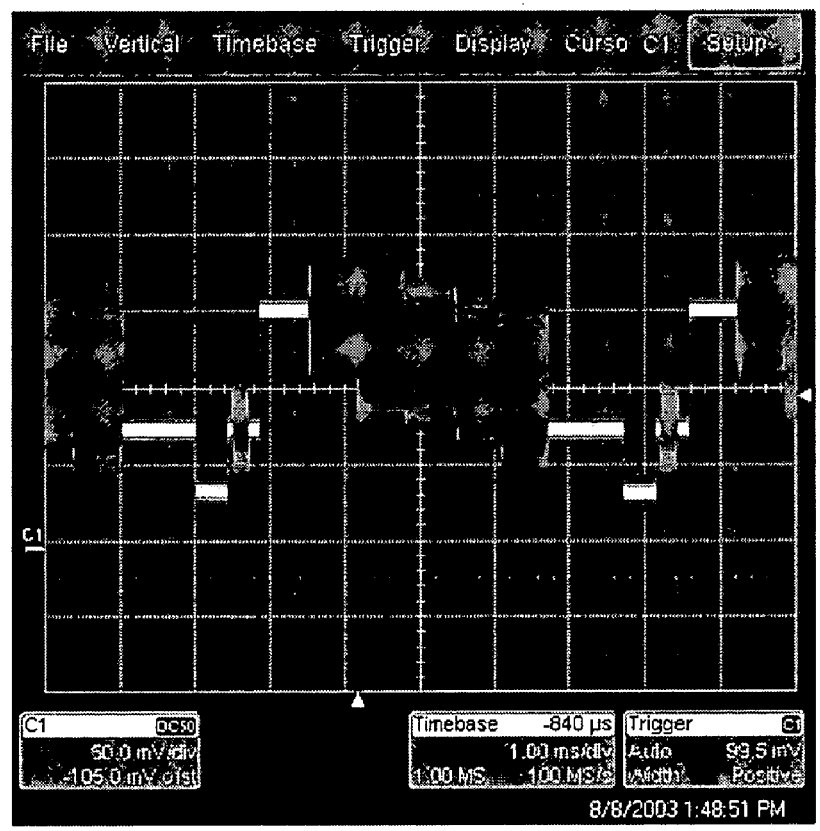
FIG. 3b is a screen shot of a television signal acquired with a digital oscilloscope, and rendered in accordance with the histogram compaction technique of the invention.
Figure 3C:
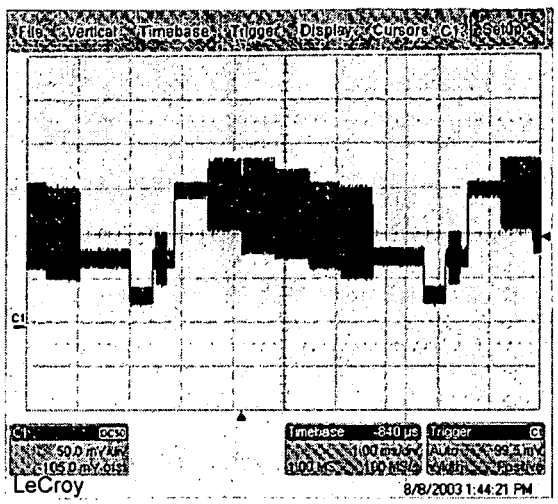
FIG. 3c is a screen shot of a television signal acquired with a digital oscilloscope, and rendered in accordance with a min/max technique.

Referring next to FIGS. 3a-3c, a television signal is shown being acquired similarly to the signal in FIGS. 2a-2c. As can be seen, the signal acquired by the digital oscilloscope in FIG. 3b, and rendered in accordance with the histogram compaction technique of the invention, very closely approximates the acquisition and display of the analog oscilloscope in FIG. 3a. However, the acquisition of the signal by a digital oscilloscope, and rendering of the signal using the min/max technique as shown in FIG. 3c does not allow the user to have any information about the internal structure of the signal.

Figure 4A:
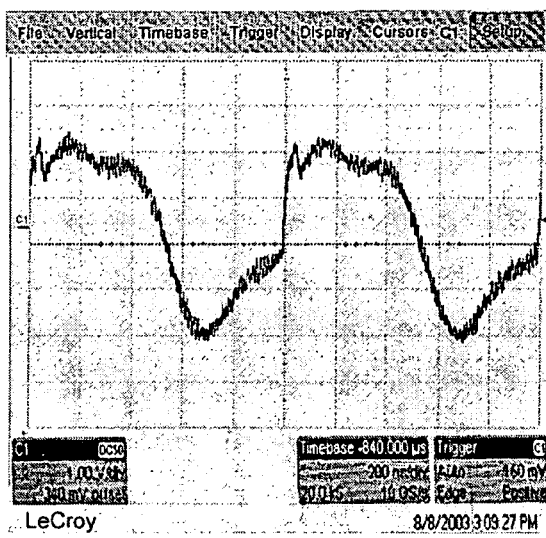
FIG. 4a is a screen shot depicting details and internal structure of a single period of a signal acquired with a digital oscilloscope.
Figure 4B:
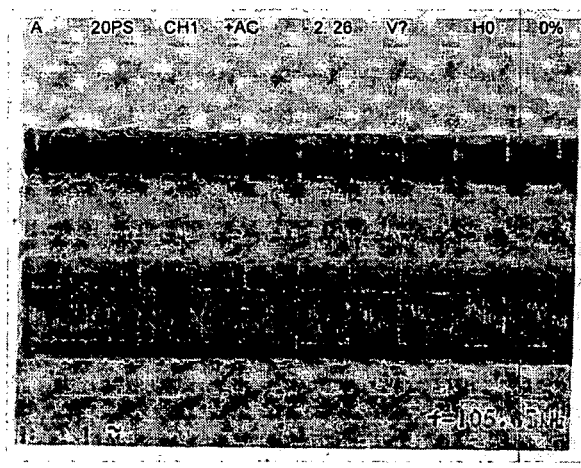
FIG. 4b is a screen shot depicting the signal shown in FIG. 4a, acquired over a plural number of periods on an analog oscilloscope.
Figure 4C:
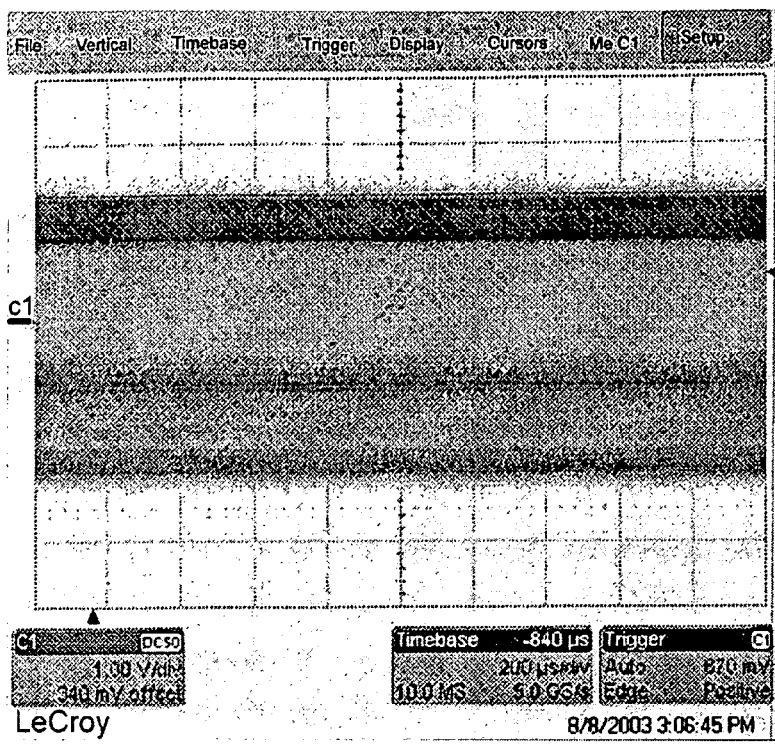
FIG. 4c is a screen shot depicting the signal shown in FIG. 4a, acquired over a plural number of periods on a digital oscilloscope, and rendered in accordance with the histogram compaction technique of the invention.
Figure 4D:
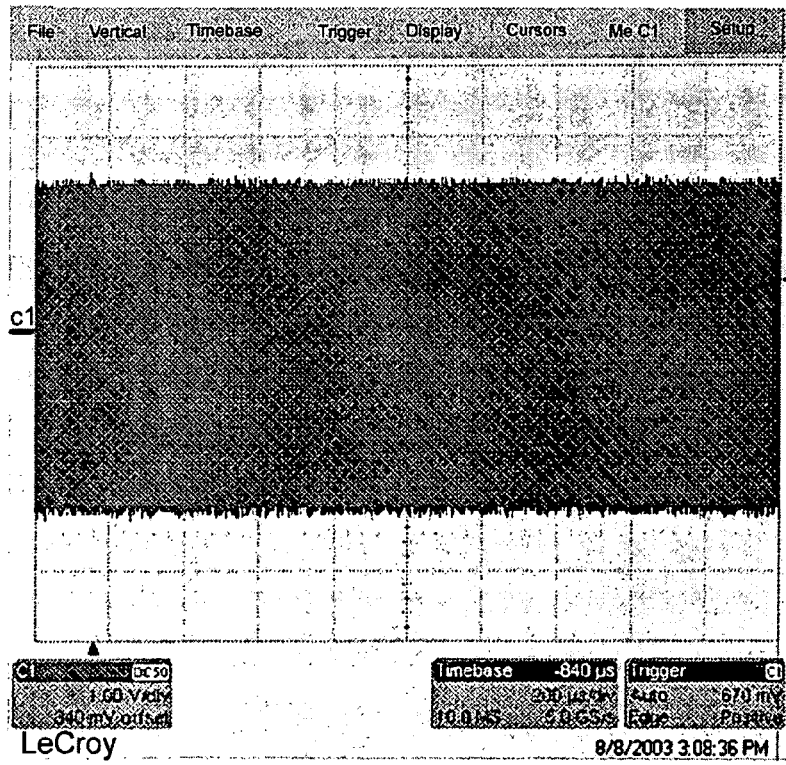
FIG. 4d is a screen shot depicting the signal shown in FIG. 4a, acquired over a plural number of periods on a digital oscilloscope, and rendered in accordance with a min/max technique.

Referring next to FIGS. 4a-4d, a signal depicting internal structure is acquired and rendered by a digital oscilloscope in FIG. 4a. The signal shown in FIG. 4a is a single period acquisition. If a user wants to view the signal response over multiple periods, the user "Zooms out" so that the y-axis time scale covers a far greater time period. Rather than a single signal period stretching over the entire display, the single period takes up only a small portion of the display. Such a display is shown as acquired by an analog oscilloscope in FIG. 4b. The internal structure of the signal is clearly visible. In FIG. 4c the same signal is acquired by a digital oscilloscope employing the histogram compaction technique of the invention. The internal structure of the signal is still visible. However, when the prior art min/max rendering technique is employed on a digitally acquired signal (see FIG. 4d) the internal structure of the signal is not visible, thus providing the user with substantially less information about the signal.

Therefore, in accordance with the invention, a user is provided with a digital view of a signal that allows for the internal structure of the signal to be seen, much as in the acquisition of the signal on an analog oscilloscope.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall there between.

What is claimed:

1. A method performed by a processor for displaying an acquired signal on an oscilloscope, comprising the steps of:
   acquiring a data signal;
   determining, by said processor, a plurality of samples of the acquired data signal representing samples at different times that are to be represented by each of a plurality of vertical pixel columns of a display;
   generating, by said processor, a histogram of the values of the samples for each vertical pixel column;
   determining, by said processor, a discontinuity in histogram values between histograms associated with adjacent pixel columns;
   removing, by said processor, the discontinuity by filling in histogram bins with a value for the bins corresponding to the discontinuity; and
   modifying, by said processor, a display characteristic of information displayed in one or more of the vertical pixel columns based upon values in the histogram corresponding to each vertical pixel column.

2. The method of claim 1, wherein the discontinuity is determined by comparing a minimum signal value represented by a first histogram to a maximum signal value represented by a second histogram to be displayed in adjacent vertical pixel columns.

3. The method of claim 2, wherein a discontinuity is present when it is determined that the minimum signal value represented by the first histogram is larger than the maximum signal value represented by the second histogram.

4. The method of claim 3, wherein the histogram bins are filled in by determining a midpoint between signal values at each end of the discontinuity, and filling in bins for each histogram from the signal value of that histogram at one end of the discontinuity up to the midpoint.

5. The method of claim 1, wherein the value filled into the histogram bins is one.

6. An oscilloscope, comprising:
   an acquisition board for acquiring a data signal; and
   a processor for determining a plurality of samples of the acquired data signal representing samples at different times that are to be represented by each of a plurality of vertical pixel columns of a display, generating a histogram of the values of the samples for each vertical pixel column, determining a discontinuity in histogram values between histograms associated with adjacent pixel columns, removing the discontinuity by filling in histogram bins with a value for the bins corresponding to the discontinuity, and modifying a display characteristic of information to be displayed in one or more of the vertical pixel columns of a display based upon values in the histogram corresponding to each vertical pixel column.

7. The oscilloscope of claim 6, wherein the processor determines the discontinuity by comparing a minimum signal value represented by a first histogram to a maximum signal value represented by a second histogram to be displayed in adjacent vertical pixel columns.

8. The oscilloscope of claim 7, wherein a discontinuity is present when it is determined by the processor that the minimum signal value represented by the first histogram is larger than the maximum signal value represented by the second histogram.

9. The oscilloscope of claim 8, wherein the histogram bins are filled in by determining a midpoint between signal values at each end of the discontinuity, and filling in bins for each histogram from the signal value of that histogram at one end of the discontinuity up to the midpoint.

10. The oscilloscope of claim 6, wherein the value filled into the histogram bins is one.

11. The oscilloscope of claim 6, further comprising a display for displaying the information including the modified display characteristic.

12. An oscilloscope, comprising:

acquisition means for acquiring a data signal; and processing means for determining a plurality of samples of the acquired data signal representing samples at different times that are to be represented by each of a plurality of vertical pixel columns of a display, generating a histogram of the values of the samples for each vertical pixel column, determining a discontinuity in histogram values between histograms associated with adjacent pixel columns, removing the discontinuity by filling in histogram bins with a value for the bins corresponding to the discontinuity, and modifying a display characteristic of information to be displayed in one or more of the vertical pixel columns of a display based upon values in the histogram corresponding to each vertical pixel column.

13. The oscilloscope of claim 12, wherein the processing means determines the discontinuity by comparing a minimum signal value represented by a first histogram to a maximum signal value represented by a second histogram to be displayed in adjacent vertical pixel columns.

14. The oscilloscope of claim 12, wherein a discontinuity is present when it is determined by the processing means that the minimum signal value represented by the first histogram is larger than the maximum signal value represented by the second histogram.

15. The oscilloscope of claim 13, wherein the histogram bins are filled in by determining a midpoint between signal values at each end of the discontinuity, and filling in bins for each histogram from the signal value of that histogram at one end of the discontinuity up to the midpoint.

16. The oscilloscope of claim 12, wherein the value filled into the histogram bins is one.

17. The oscilloscope of claim 12, further comprising display means for displaying the information including the modified display characteristic.

* * * * *